(12) United States Patent
Ohta et al.

(10) Patent No.: US 6,192,003 B1
(45) Date of Patent: Feb. 20, 2001

(54) SEMICONDUCTOR MEMORY DEVICE USING A RELATIVELY LOW-SPEED CLOCK FREQUENCY AND CAPABLE OF LATCHING A ROW ADDRESS AND A COLUMN ADDRESS WITH ONE CLOCK SIGNAL AND PERFORMING A PAGE OPERATION

(75) Inventors: Kiyoto Ohta; Tomonori Fujimoto, both of Osaka (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/444,559

(22) Filed: Nov. 19, 1999

(30) Foreign Application Priority Data

Nov. 30, 1998  (JP) .................................................. 10-338956

(51) Int. Cl.[7] ....................................................... G11C 8/00
(52) U.S. Cl. .................. 365/233; 365/230.01; 365/238.5
(58) Field of Search ..................................... 365/233, 235, 365/238.5, 189.04, 194, 203, 230.09, 230.01

(56) References Cited

U.S. PATENT DOCUMENTS

| | | | |
|---|---|---|---|
| 5,077,693 | 12/1991 | Hardee et al. . | |
| 5,278,792 | * 1/1994 | Inoue et al. | 365/193 |
| 5,717,653 | * 2/1998 | Suzuki | 365/233 |
| 5,880,998 | * 3/1999 | Tanimura et al. | 365/189.05 |
| 5,953,261 | * 9/1999 | Furutani et al. | 365/189.05 |

* cited by examiner

Primary Examiner—David Nelms
Assistant Examiner—Thong Le
(74) Attorney, Agent, or Firm—McDermott, Will & Emery (57) ABSTRACT

A semiconductor memory device includes a memory cell array, a plurality of word lines selectively activated by a row address signal from the outside, a plurality of bit lines selected by a column address signal from the outside, and sense amplifiers connected to the bit lines. The device further includes a row address latch circuit for latching the row address signal by using, as a trigger, a first edge of a clock signal from the outside, a sense amplifier activating circuit for activating the sense amplifier after a lapse of a given time from the first edge, a column address latch circuit for latching a column address signal by using, as a trigger, a second edge of the clock signal occurring after the first edge, and a precharge signal generating circuit for generating a precharge signal for precharging the bit lines after a lapse of a given time from the second edge.

6 Claims, 5 Drawing Sheets

SEMICONDUCTOR MEMORY DEVICE USING A RELATIVELY LOW-SPEED CLOCK FREQUENCY AND CAPABLE OF LATCHING A ROW ADDRESS AND A COLUMN ADDRESS WITH ONE CLOCK SIGNAL AND PERFORMING A PAGE OPERATION

BACKGROUND OF THE INVENTION

The present invention relates to semiconductor memory devices and, more particularly, to a DRAM-type semiconductor memory device using a relatively low-speed clock frequency and capable of latching a row address and a column address with one clock signal and performing a page operation.

First, a dynamic RAM (DRAM) device as a conventional semiconductor memory device will be described with reference to the drawings.

Figure 5A:
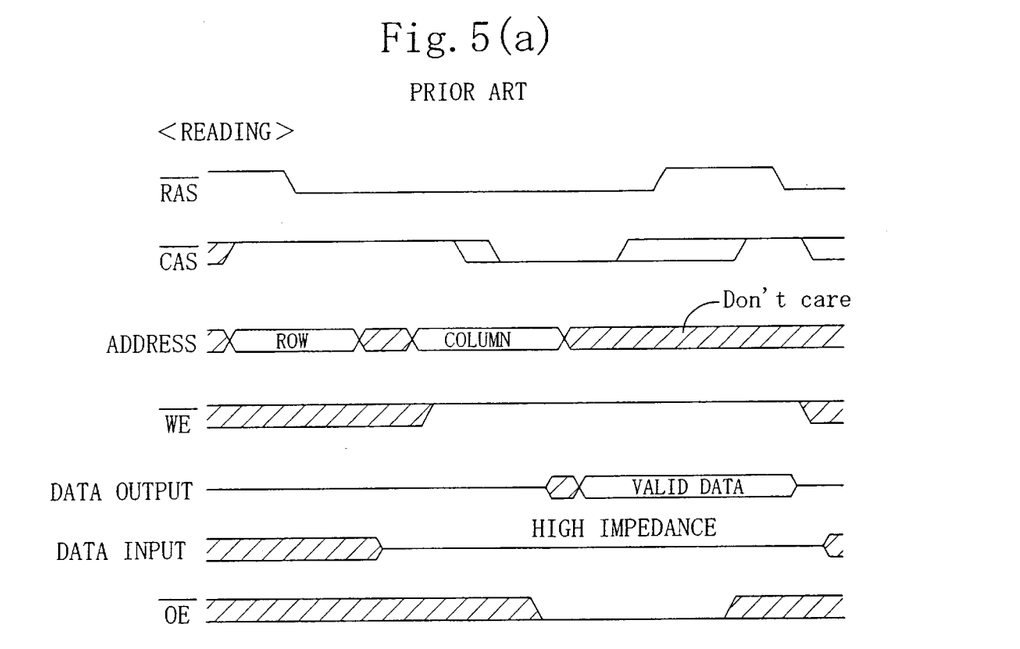
FIGS. 5(a) and 5(b) are timing charts showing write and read operations in a conventional semiconductor memory device.
Figure 5B:
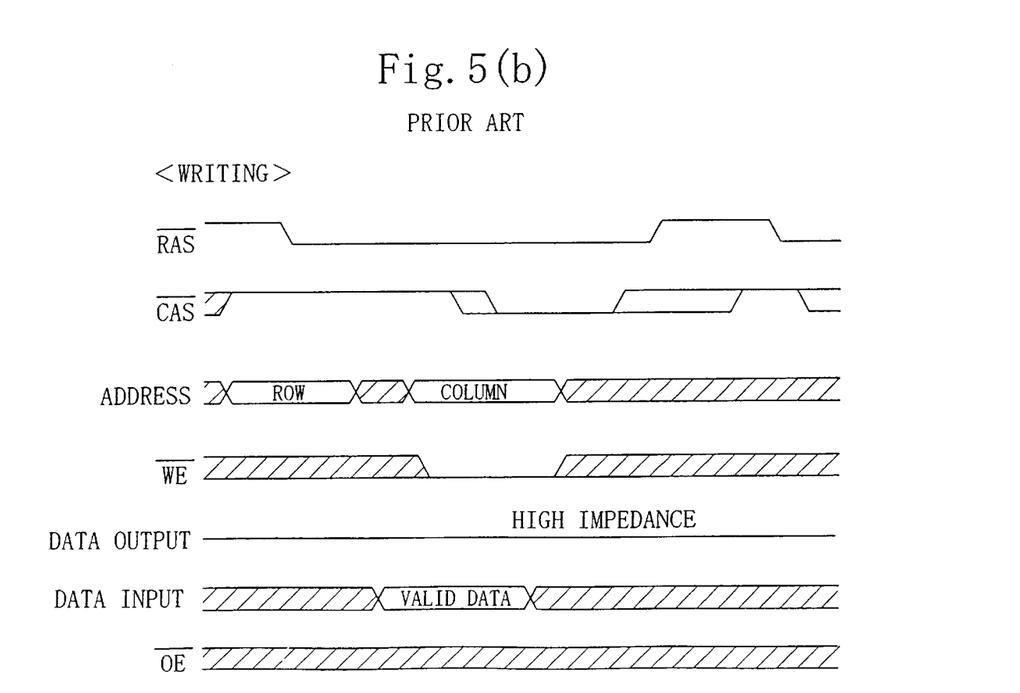

FIGS. 5(a) and 5(b) are timing charts for the data I/O of the conventional DRAM, of which FIG. 5(a) shows a read operation and FIG. 5(b) shows a write operation. In a read operation, as shown in FIG. 5(a), a row address strobe (/RAS) signal, which is a first clock signal, is initially caused to fall to activate a row-related circuit that has been in a precharged state so far, whereby a memory operation is initiated and the row address is latched. After a lapse of a given time, a column address strobe (/CAS) signal, which is a second clock signal, is subsequently caused to fall, whereby a read operation is initiated and a column address is latched. This activates memory cells connected to a selected word line as well as a sense amplifier circuit connected to a selected pair of bit lines. At this time, a write control signal /WE is brought to the HIGH level to disable a write operation, whereby a potential difference read onto the pair of bit lines connected to a selected memory cell is amplified to determine valid data and further output to the outside via a read amplifier or the like.

In a write operation also, as shown in FIG. 5(b), the /RAS signal is initially caused to fall to latch a row address and then the /CAS signal is caused to fall to latch a column address. This activates the memory cell connected to the selected word line as well as a sense amplifier connected to the selected pair of bit lines. At this time, the write control signal /WE is shifted the LOW level to enable a write operation and valid data to be held in the selected memory cell is input from a write amplifier or the like.

In the present embodiment, the mark / preceding the name of a signal indicates that the signal is inverted. The signal preceded by the mark / is in the active state when it is LOW (active LOW).

However, the conventional DRAM device requires two clock signals for synchronization to latch a row address and a column address for selecting one from a plurality of memory cells in a memory cell array, which are the RAS signal and the CAS signal. Accordingly, control operation over the clock becomes complicated. In the case of merging the DRAM and a logic circuit into one chip, designing difficulties are particularly increased.

SUMMARY OF THE INVENTION

It is therefore an object of the present invention to solve the conventional problem and provide easy handling of a clock signal for the synchronization of a semiconductor memory.

To attain the object, the present invention has allotted a trigger used to latch the row and column addresses of an address signal to the both edges of one clock signal.

Specifically, a semiconductor memory device according to the present invention comprises: a memory cell array having a plurality of memory cells each for retaining data; a plurality of word lines selectively activated by a row address signal from the outside; a plurality of bit lines each being selected by a column address signal from the outside; sense amplifiers each for amplifying data read onto the bit lines connected thereto; row address latch means for latching the row address signal by using, as a trigger, a first edge of a clock signal from the outside; sense amplifier activating means for activating the sense amplifiers after a lapse of a given delay time from the first edge; column address latch means for latching the column address signal by using, as a trigger, a second edge of the clock signal occurring after the first edge; and precharge signal generating means for generating a precharge signal for precharging the bit lines after a lapse of a given delay time from the second edge.

In the semiconductor memory device of the present invention, the row address is latched by using either the rising edge or falling edge of one clock signal and the sense amplifier is activated after a lapse of a given time from the latching of the row address, while the column address is latched by using the other edge and the bit lines are precharged after a lapse of a given time from the latching of the column address. As a result, a selective read or write operation with respect to the plurality of memory cells can be performed periodically and positively by using one clock. This achieves easy handling of a clock signal for synchronizing a memory operation.

In the semiconductor memory device of the present invention, the first and second edges of the clock signal preferably correspond to a falling edge and a rising edge, respectively, or to a rising edge and a falling edge, respectively. This implements a high-speed operation in which a latency, which is the time required to execute one instruction, is 1 clock.

Preferably, the semiconductor memory device of the present invention further comprises write control means for judging whether a write control signal for determining whether data should be written in the memory cell or not is in one state or in the other state by using the second edge as a trigger and enabling a write operation when the result of judgment indicates the one state or disabling the write operation when the result of judgment indicates the other state. This ensures that either the write operation or read operation is solely performed.

Preferably, the semiconductor memory device of the present invention further comprises page-mode control means for judging whether a page-mode control signal for determining whether a page mode should be set or not is in one state or in the other state by using, as a trigger, the first or second edge of the clock signal and enabling the precharging of the bit lines by using the second edge as a trigger, while enabling the operation of latching another row address signal by using a third edge occurring after the second edge as a trigger if the result of judgment indicates one state or disabling the precharging of the bit lines by using the second edge as a trigger, while disabling the operation of latching another row address signal by using the third edge as a trigger if the result of judgment indicates the other state. In the arrangement, if the result of judgment indicates one state such as the OFF state, the precharging of the bit lines on the second edge used as a trigger is enabled and the operation of latching another row address signal by using the third edge occurring after the second edge is enabled. Accordingly, the operational mode becomes a normal mode (non-page mode). If the result of judgment indicates the other state such as the ON state, on the other hand, the precharging of the bit lined on the second edge used as a trigger is disabled and the operation of latching another row address signal by using the third edge as a trigger is disabled. This prevents the destruction of data read into the sense amplifier in the clock cycle including the second edge and implements the page mode.

In this case, the first, second, and third edges of the clock signal preferably correspond to a falling edge in a first clock cycle, a rising edge in the first clock cycle, and a falling edge in a second clock cycle subsequent to the first clock cycle in this order or correspond to the rising edge in the first clock cycle, the falling edge in the first clock cycle, and the rising edge in the second clock cycle subsequent to the first clock cycle in this order. This implements a high-speed operation in which a latency, which is the time required to execute one instruction, is 1 clock.

Preferably, the semiconductor memory device of the present invention further comprises: a data output circuit for outputting data amplified by the sense amplifiers to the outside and data output disabling means for disabling the operation of the data output circuit after a lapse of a given time from the first edge. In the arrangement, the operation of the data output circuit is disabled upon receipt of an input to I/O so that there is no collision between the read data read from the sense amplifier and the written data input from the outside. This obviates the necessity for a read dummy cycle during a write operation and the necessity for a write dummy cycle during a read operation.

DETAILED DESCRIPTION OF THE INVENTION

Referring to the drawings, an embodiment of the present invention will be described.

Device Configuration

Figure 1:
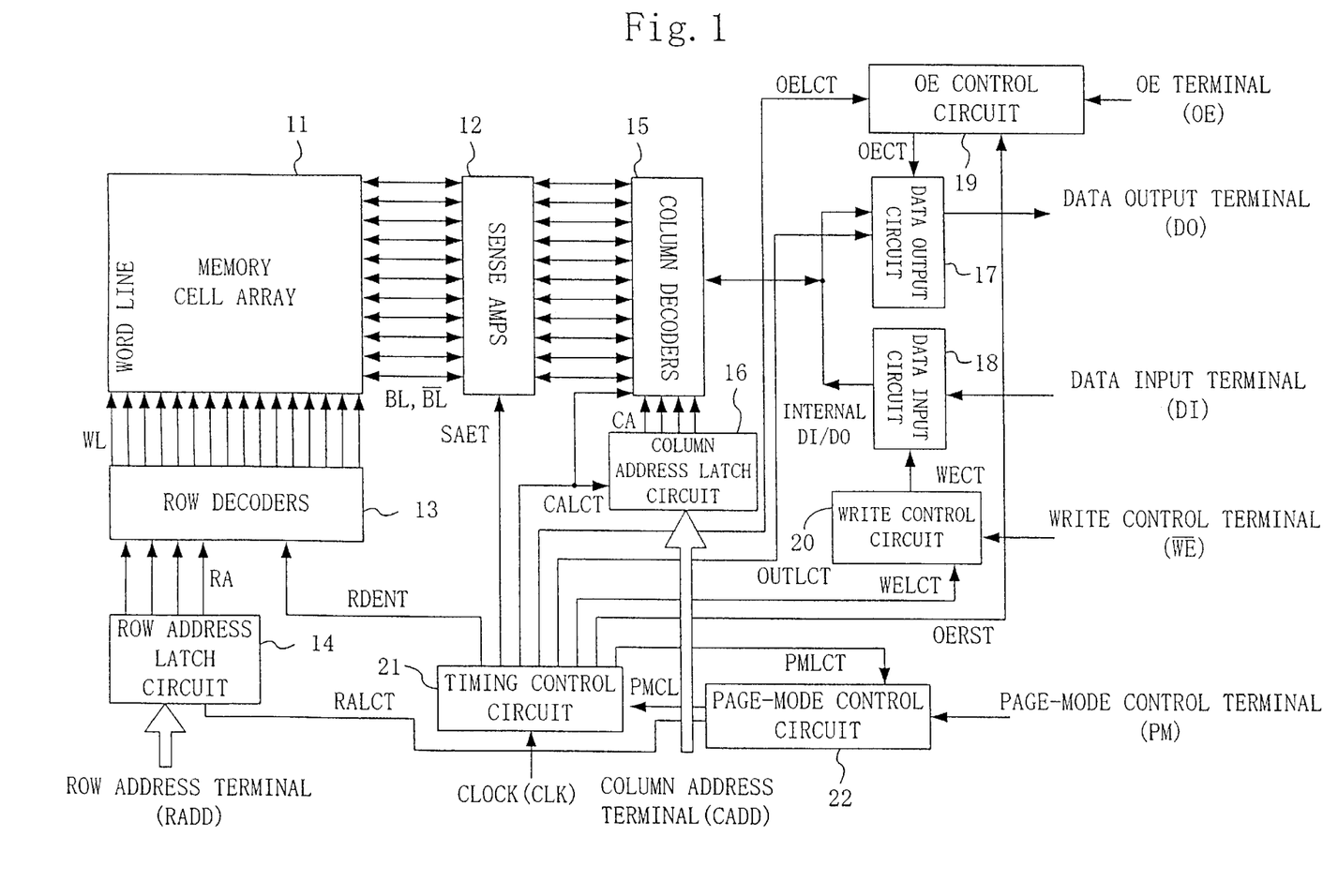
FIG. 1 is a functional block diagram showing a semiconductor memory device according to an embodiment of the present invention.

FIG. 1 shows the functional block configuration of a semiconductor memory device according to the embodiment. As shown in FIG. 1, there are disposed: a memory cell array 11 having a plurality of memory cells (not shown) each for retaining data; 256 word lines WL connected to the memory cell array 11; 256 pairs of bit lines BL, /BL connected to the memory cell array 11; and a group of sense amplifiers 12 each provided for the corresponding pair of bit lines BL, /BL to determine a data value by amplifying an extremely low potential at the memory cell that has been read.

As a row-related circuit, a group of row decoders 13 each provided for the corresponding one of the word lines WL to select the word line WL based on a row address signal RA are connected to the word lines WL. A row address latch circuit 14 for latching a row address signal RADD from a row address terminal and outputting the latched row address signal RADD to the row decoders 13 is connected to the row decoders 13.

As a column-related circuit, on the other hand, a group of column decoders 15 for selecting among the pairs of bit lines BL, /BL based on a column address signal CA are connected to the pairs of bit lines BL, /BL. A column address circuit 16 for latching a column address signal CADD from a column address terminal and outputting the latched column address signal CADD to the column decoders 15 is connected to the column address decoders 15. Optionally, a single common terminal may be used as the row address terminal and the column address terminal.

A data output circuit 17 and a data input circuit 18 are connected to the column decoders 15. In a read operation, internal data read into the data output circuit 17 via the column decoders 15 is output as a data output signal DO to a data output terminal. In a write operation, a data input signal DI input to the data input circuit 18 from a data input terminal is output onto the selected pair of bit lines BL, /BL via the column decoders 15. Optionally, a single common terminal may be used as the data input terminal and the data output terminal.

An OE control circuit 19 as data output disable means is connected to the data output circuit 17. The OE control circuit 19 receives an output enable signal OE for controlling the operation of the data output circuit 17, which has been input from the outside, and outputs an output control enable signal OECT for determining the period during which read data is output to the data output circuit 17. A write control circuit 20 is connected to the data input circuit 18. The write control circuit 20 receives a write control signal /WE for controlling the operation of the data input circuit 18, which has been input from the outside, and generates an internal write control signal WECT for controlling the period during which written data is valid based on the received write control signal /WE and outputs the generated internal write control signal WECT to the data input circuit 18.

The present embodiment features a timing control circuit 21 for receiving one clock signal CLK and outputting various control signals for controlling read and write operations in the device.

Specifically, the timing control circuit 21 outputs, to the sense amplifiers 12, a sense amplifier enable signal or bit line precharge signal SAET for controlling the active and inactive states (precharged state) of the sense amplifiers 12 and outputs, to the row decoders 13, a row decoder enable signal RDENT for controlling the active and inactive states of the row decoders 13. The signal SAET becomes the sense amplifier enable signal when it is HIGH and becomes the bit line precharge signal when it is LOW.

The timing control circuit 21 outputs a column address latch clock or latch output enable signal CALCT for controlling the operations of the column decoders 15 and column address latch circuit 16 to the column decoders 15 and the column address latch circuit 16, while outputting an output data latch clock OUTLCT used as a trigger for latching the read data to the data output circuit 17.

Further, the timing control circuit 21 outputs, to the OE control circuit 19, an output enable latch clock OELCT used as a trigger for the operational timing of the OE control circuit 19 and an output enable reset signal OERST for resetting an output control enable signal OECT, while outputting, to the write control circuit 20, a write signal latch clock WELCT used as a trigger for the operational timing of the write control circuit 20.

The timing control circuit 21 is connected to a page-mode control circuit 22 and outputs, to the page-mode control circuit 22, a page-mode latch clock PMLCT used as a trigger for the operational timing of the page-mode control circuit 22.

The page-mode control circuit 22 receives a page-mode control signal PM for setting a page mode in the device and outputs a page-mode latch data signal PMCL, which is a latched page-mode control signal PM, to the timing control circuit 21, while outputting, to the row address latch circuit 14, a row address latch signal RALCT used as a trigger for the operational timing of the row address latch circuit 14.

Figure 2:
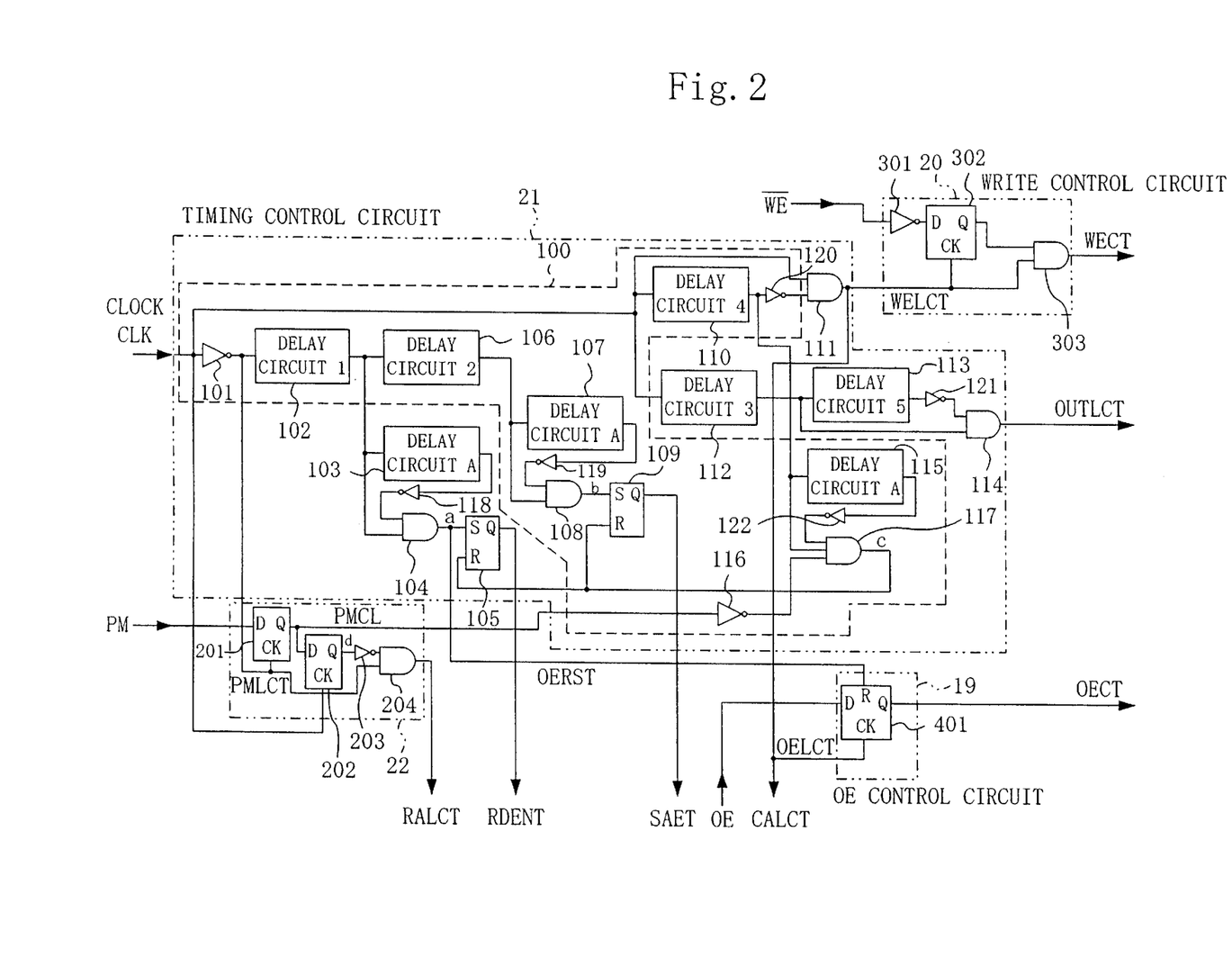
FIG. 2 is a circuit diagram showing timing generating means in the semiconductor memory device according to the embodiment.

FIG. 2 shows a detailed example of the configurations of the OE control circuit 19, the write control circuit 20, the timing control circuit 21, and the page-mode control circuit 22 according to the present embodiment.

As shown in FIG. 2, the timing control circuit 21 has: a first inverter 101 for receiving a clock signal CLK for synchronization input from the outside, inverting the falling edge of the input clock signal CLK, and thereby bringing the clock signal CLK to the active HIGH state; and a first delay circuit 102 for generating a first delay time. To the output side of the first delay circuit 102, there are connected a second delay circuit 103 with a delay amount A, i.e., with a pulse width A, a first AND circuit 104 having one input terminal for receiving an output of the first delay circuit 102 and the other input terminal for receiving an output of the second delay circuit 103 which has been inverted by a second inverter 118, and a first flip-flop 105 for receiving an output of the first AND circuit 104 and outputting the row decoder enable signal RDENT.

To the output side of the first delay circuit 102, there is connected a third delay circuit 106 for generating a second delay time. To the output side of the third delay circuit 106, there are connected a fourth delay circuit 107 with a delay amount A, a second AND circuit 108 having one input terminal for receiving an output of the third delay circuit 106 and the other input terminal for receiving an output of the fourth delay circuit 107 which has been inverted by the third inverter 119, and a second flip-flop 109 for receiving an output of the second AND circuit 108 and outputting the sense amplifier enable signal or bit line precharge signal SAET.

To the clock input terminal of the timing control circuit 21, there are connected a fifth delay circuit 110 for generating a fourth delay time and a third AND circuit 111 having one input terminal for receiving an output of the fifth delay circuit 110 which has been inverted by the fourth inverter 120 and the other input terminal for receiving the clock signal CLK, while outputting the write signal latch clock WELCT, the output enable latch clock OELCT, and the column address latch clock or latch output enable signal CALCT.

To the clock input terminal, a sixth delay circuit 112 for generating a third delay time is also connected in parallel to the fifth delay circuit 110. To the output side of the sixth delay circuit 112, there are connected a seventh delay circuit 113 for generating a fifth delay time and a fourth AND circuit 114 having one input terminal for receiving an output of the sixth delay circuit 112 and the other input terminal for receiving an output of the seventh delay circuit 113 which has been inverted by the fifth inverter 121, while outputting an output data latch clock OUTLCT.

To the output side of the fifth delay circuit 110, there are connected an eighth delay circuit 115 with a delay amount A and a fifth AND circuit 117 having a first input terminal for receiving an output of the eighth delay circuit 115 which has been inverted by a sixth inverter 122, a second input terminal for receiving an output of the fifth delay circuit 110, and a third input terminal for receiving an inverted signal of the page-mode latch data signal PMCL generated by a seventh inverter 116, while outputting an operation result c to the respective reset input terminals of the first and second flip-flops 105 and 109. In the present embodiment, a sense amplifier activating means and a precharge signal generating means 100 are composed of a component for generating the operation result c and a component for receiving the operation result c.

The page-mode control circuit 22 shown in FIG. 2 comprises: a first flip-flop 201 having an input terminal for receiving a page-mode control signal PM from the outside and a clock input terminal for receiving the page-mode latch clock PMLCT from the first inverter 101 of the timing control circuit 21, while outputting the page-mode latch data signal PMCL to the timing control circuit 21; a second flip-flop 202 having an input terminal for receiving the page-mode latch data signal PMCL and a clock input terminal for receiving a clock signal CLK from the outside, while outputting a signal d; and an AND circuit 204 having one input terminal for receiving the page-mode latch clock PMLCT and the other input terminal for receiving an inverted signal of the signal d generated by the inverter 203, while outputting the row address latch signal RALCT.

The write control circuit 20 shown in FIG. 2 comprises: a flip-flop 302 having an input terminal for receiving an inverted signal of the write control signal /WE from the outside which has been generated by the inverter 301 and a clock input terminal for receiving the write signal latch clock WELCT from the timing control circuit 21; and an AND circuit 303 having one input terminal for receiving the write signal latch clock WELCT and the other input terminal for receiving an output of the flip-flop 302, while outputting an operation result as an internal write control signal WECT.

The OE control circuit 19 shown in FIG. 2 comprises a flip-flop 401 having an input terminal for receiving an output enable signal OE from the outside, a clock input terminal for receiving the output enable latch clock OELCT from the timing control circuit 21, and a reset input terminal for receiving the output enable reset signal OERST from the first AND circuit 104 of the timing control circuit 21, while outputting the output control enable signal OECT.

Operational Timing

A description will be given to the operational timing of the semiconductor memory device thus configured.

Figure 3:
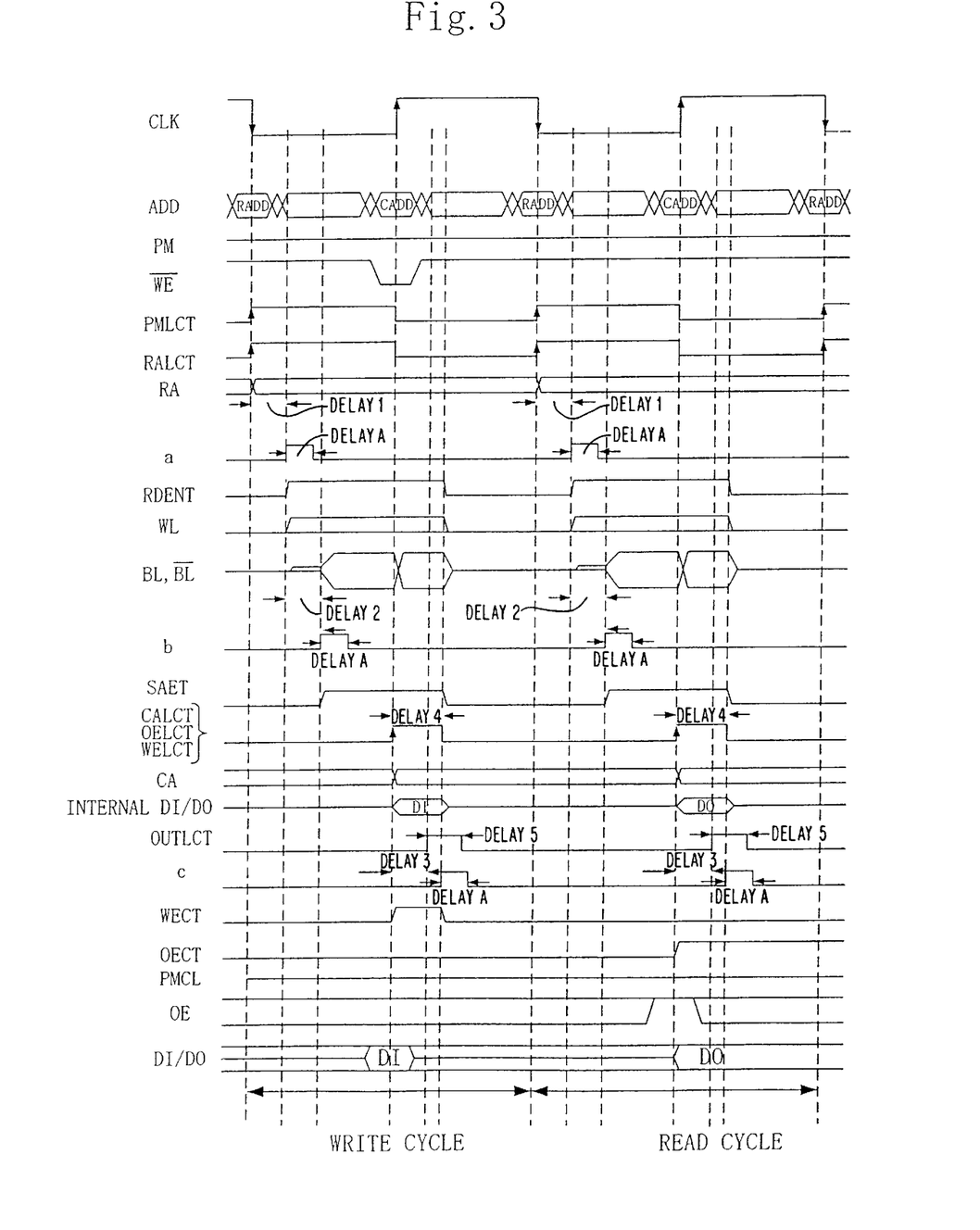
FIG. 3 is a timing chart showing normal write and read operations in the semiconductor memory device according to the embodiment.

FIG. 3 is a timing chart for normal write and read operations in the semiconductor memory device according to the present embodiment.

First, the normal write operation, i.e., a write operation in non-page mode will be described with reference to FIGS. 1 to 3.

Normal Writing

As shown in the circuit diagram of FIG. 2 and in the write cycle of FIG. 3, the page-mode latch clock PMLCT at the HIGH level is output from the timing control circuit 21 by using the rising edge of the clock signal CLK as a trigger. Since the page-mode control signal PM is LOW (inactive), the row address latch signal RALCT at the HIGH level is output from the page-mode control circuit 22.

Next, the row address latch circuit 14 shown in FIG. 1 outputs, upon receipt of the row address latch signal RALCT on the rising edge, row address latch data RA which is the latched row address signal RADD to the row decoders 13.

Next, as shown in FIGS. 2 and 3, the row decoder enable signal RDENT at the HIGH level is output from the timing control circuit 21 after a lapse of the first delay time generated by the first delay circuit 102. The row decoder enable signal RDENT at the HIGH level is input to the row decoders 13 shown in FIG. 1 to initiate selective driving of the row decoders 13. This activates the selected one of the word lines WL, with the result that a small potential difference resulting from each one of the 256 memory cells connected to the selected word line WL is produced on each one of 256 pairs of bit lines BL, /BL connected to the 256 memory cells.

Next, as shown in FIGS. 2 and 3, the sense amplifier enable signal SAET at the HIGH level is output from the timing control circuit 21 after a lapse of the second delay time generated by the third delay circuit 106. The sense amplifier enable signal SAET at the HIGH level is input to the sense amplifiers 12 shown in FIG. 1 to activate all the sense amplifiers 12.

Next, as shown in FIG. 3, the write control signal /WE is caused to fall prior to the inputting of the rising edge of the clock signal.

Next, as shown in FIGS. 2 and 3, the timing control circuit 21 outputs the page-mode latch clock PMLCT at the LOW level by using, as a trigger, the rising edge of the clock signal CLK, while outputting the column address latch clock or latch output enable signal CALCT at the HIGH level and the write signal latch clock WELCT at the HIGH level. Consequently, the column address latch clock or latch output enable signal CALCT at the HIGH level is input to the column decoders 15 and to the column address latch circuit 16, each of which is shown in FIG. 1. In response to the rising edge of the input signal CALCT, the column address latch circuit 16 latches the column address signal CADD and outputs the latched signal as the column address latch data CA to the column decoders 15. As a result, the column decoders 15 are activated.

On the other hand, the write control circuit 20 shown in FIG. 2 receives the write signal latch clock WELCT on the HIGH level and outputs the internal write control WECT on the HIGH level because the inverted signal of the write control signal /WE is HIGH. Accordingly, the data input circuit 18 that has received the internal write control signal WECT on the HIGH level latches the data input signal (write data) DI, outputs the data input signal DI latched thereby onto the selected pair of bit lines BL, /BL via the column decoders 15, and thereby writes the input signal DI in a memory cell. FIG. 3 illustrates the case of inversion writing in which the pair of bit lines BL, /BL have inverse data values.

At this time, since the output control enable signal OECT output from the OE control circuit 19 shown in FIG. 2 is inactive, the data output circuit 17 shown in FIG. 1 is in the disabled state. This prevents a collision between the read output data and the written data input from the outside so that it is no more necessary to provide a read dummy cycle upon receipt of an input to I/O, resulting in easy I/O control.

Next, as shown in FIGS. 2 and 3, each of the column address latch clock or latch output enable signal CALCT and the write signal latch clock WELCT becomes LOW and inactivated after a lapse of the fourth delay time generated by the fifth delay circuit 110 of the timing control circuit 21. On the other hand, the reset signal c at the LOW level is output from the fifth AND circuit 117 and input to the first and second flip-flops 105 and 109. As a result, each of the sense amplifier enable signal or bit line precharge signal SAET and the row decoder enable signal RDENT becomes LOW and shifts to the inactive state.

Since the column address latch clock or latch output enable signal CALCT becomes LOW, the column decoders 15 shown in FIG. 1 shift to the disabled state. Since the write signal latch clock WELCT becomes LOW, the internal write control signal WECT becomes LOW. As a result, the data input signal DI is no more output from the data input circuit 18.

Since the sense amplifier enable signal or bit line precharge signal SAET becomes LOW, the sense amplifiers 12 are inactivated so that each pair of bit lines BL, /BL are precharged. Since the row decoder enable signal RDEN becomes LOW, the activated word line WL is inactivated.

Next, the normal read operation or a read operation in non-page mode will be described with reference to FIGS. 1 to 3.

Normal Reading

As shown in the circuit diagram of FIG. 2 and in the read cycle of FIG. 3, the page-mode latch clock PMLCT at the HIGH level is output from the timing control circuit 21 by using the falling edge of the clock signal CLK as a trigger. Since the page-mode control signal PM is LOW (inactive), the row address latch signal RALCT at the HIGH level is output from the page-mode control circuit 22.

Below, the description will be given only to differences between the normal read and write operations.

As shown in FIG. 3, the write control signal /WE is HIGH and inactive on the rising edge of the clock signal CLK so that the internal write control signal WECT output from the write control circuit 20 shown in FIG. 2 remains LOW and the device is in the write disabled state. As a result, the data input circuit 18 shown in FIG. 1 is disabled.

On the other hand, since the output enable signal OE input from the outside has shifted to the HIGH level, as shown in FIG. 3, the output control enable signal OECT at the HIGH level is output from the OE control circuit 19 shown in FIG. 2. This enables the data output circuit 17 shown in FIG. 1 so that read data in that one of the already activated sense amplifiers 12 selected based on the column address latch data CA is read as the data output signal DO via the column decoders 15 and the data output circuit 17.

The data output signal DO that has been read is then output from the timing control circuit 21, latched in accordance with the output data latch clock OUTLCT which is a latch signal for the data output circuit 17, and output to the data output terminal.

Next, the output control enable signal OECT is reset when the output enable reset signal OERST indicative of an output value a from the first AND circuit of the timing control circuit 21 shown in FIG. 2 becomes HIGH after a lapse of the first delay time from the falling edge of the subsequent clock signal CLK. As a result, the data output circuit 17 is disabled.

Next, page-mode operations will be described.

Page-Mode Operations

Figure 4:
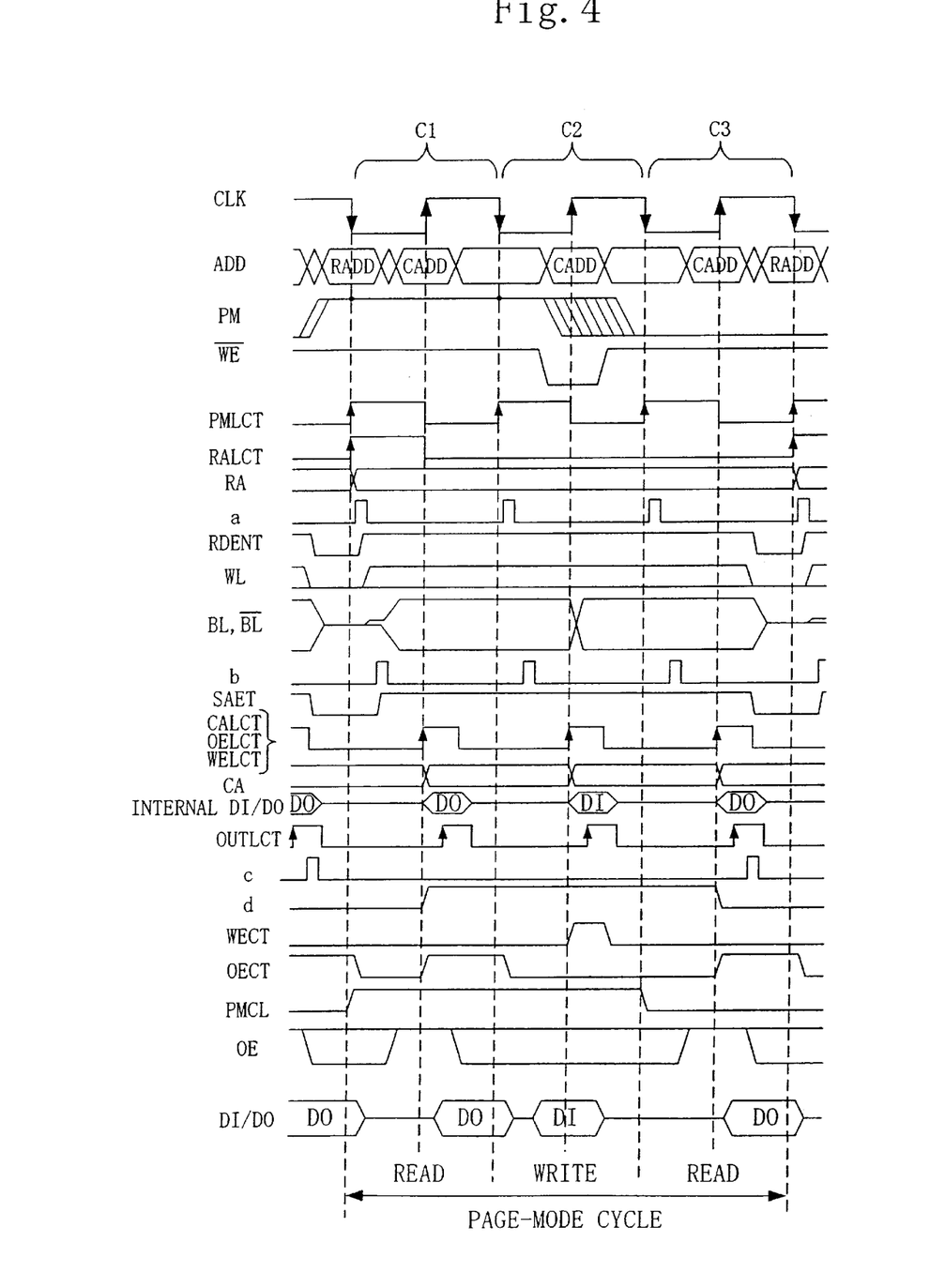
FIG. 4 is a timing chart showing page-mode write and read operations in the semiconductor device according to the embodiment.

FIG. 4 is a timing chart for page-mode read and write operations in the semiconductor memory device according to the present embodiment.

First, as shown in the circuit diagram of FIG. 2 and in the read cycle C1 of FIG. 4, the page-mode latch clock PMLCT at the HIGH level is output from the timing control circuit 21 by using the falling edge of the clock signal CLK as a trigger. At the same time, the page-mode control circuit 22 for receiving the page-mode latch clock PMLCT at the HIGH level receives the page-mode control signal PM at the HIGH level and latches the input page-mode control signal PM.

Since the signal d output from the second flip-flop 202 is at the LOW level at this time, the row address latch signal RALCT at the HIGH level is output from the AND circuit 204. Consequently, the row address latch circuit 14 shown in FIG. 1 is activated, similarly to the normal operation, so that the selected word line WL is driven.

The difference between the normal write operation and the page-mode write operation is that, as shown in FIGS. 2 and 4, the reset signal c is not output from the fifth AND circuit 117 of the timing control circuit 21 to the first and second flip-flops 105 and 109 since the page-mode control circuit 22 outputs the page-mode latch data PMCL at the HIGH level on the rising edge of the clock signal CLK in the read cycle C1 and the fifth AND circuit 117 receives the inverted signal of the page-mode latch data PMCL. As a result, each of the row decoder enable signal RDENT output from the first flip-flop 105 and the sense amplifier enable signal or bit line precharge signal SAET output from the second flip-flop 109 remains HIGH. Accordingly, the active states of the row decoders 13 and sense amplifiers 12 shown in FIG. 1 are maintained.

Next, as shown in FIGS. 2 and 4, the row address latch signal RALCT at the LOW level is output from the page-mode control circuit 22 on the falling edge of the clock signal CLK in the subsequent write cycle C2 so that the row address latch circuit 14 shown in FIG. 1 is not activated and therefore a new row address signal RADD is not latched. As a result, the row address latch data RA selected by the row decoders 13 is held and the active state of the selected word line WL is maintained.

Next, as shown in FIGS. 2 and 4, the column address latch clock or latch output enable signal CALCT rises on the rising edge of the clock signal CLK in the subsequent write cycle C2 and the write control signal /WE is active LOW, so that the foregoing write operation is performed.

Likewise, the foregoing read operation is performed because the write control signal /WE is HIGH on the rising edge of the clock signal CLK in the subsequent read cycle C3 and the device is in the write disabled state. Since the page mode has been set, the selected word line WL is the same as in the read cycle C1. Since the page-mode control signal PM has already been inactivated, the row decoder enable signal RDENT and the sense amplifier enable signal or precharge signal SAET are reset to restore the normal operation.

Thus, according to the present embodiment, read and write operations can be performed in the DRAM device by latching the row address signal RADD on the falling edge of one clock signal CLK used as a trigger and by latching the column address signal CADD on the rising edge of the clock signal CLK used as a trigger.

By causing the row decoder enable signal RDEN to shift to the HIGH level after a lapse of a given delay time generated by the first delay circuit 102 from the falling edge of the clock signal CLK, the timing for activating the row decoders 13 is generated to provide a margin for operation of the row address latch circuit 14.

By causing the sense amplifier enable signal SAET to shift to the HIGH level after a lapse of a given delay time generated by the first and third delay circuits 102 and 106 from the falling edge of the clock signal CLK, the timing for activating the sense amplifiers 12 is generated to provide a margin allowing the charging of the pair of bit lines BL, /BL after the word line WL was activated.

By causing the row decoder enable signal RDENT and the sense amplifier enable signal or bit line precharge signal SAET to shift to the LOW level after a lapse of a given delay time generated by the fifth delay circuit 110 from the rising edge of the clock signal CLK, the row decoders 13 and the sense amplifiers 12 are inactivated to provide the timing for precharging the pair of bit lines BL, /BL.

By providing the page-mode control circuit 22, the row address latch circuit 14 is disabled and the row decoders 13 and the sense amplifiers 12 are not reset (inactivated) during the page-mode operations, so that data in the memory cell connected to the selected word line WL is maintained unless writing is newly performed. In this manner, the paging operation can surely be performed even by using one clock signal CLK.

Thus, unlike the conventional DRAM device using one pulse as RAS and another pulse subsequent to the one pulse as CAS and unlike a synchronous DRAM (SDRAM) using a relatively high-speed clock signal, the semiconductor memory device according to the present embodiment can perform a high-speed operation with a latency of 1 clock by using a relatively low-speed clock signal.

It is also possible to latch the row address signal RADD on the rising edge of the clock signal CLK and the column address signal CADD on the falling edge thereof.

It is also possible to latch the row address signal RADD on the rising edge of one clock signal CLK and latch the column address signal CADD on the rising edge of another clock signal CLK.

It is also possible to latch the page-mode control signal PM on the rising edge of the clock signal CLK.

What is claimed is:

1. A semiconductor memory device comprising:
    a memory cell array having a plurality of memory cells each for retaining data;
    a plurality of word lines selectively activated by a row address signal;
    a plurality of bit lines each being selected by a column address signal;
    sense amplifiers for amplifying data read out onto the bit lines connected thereto;
    a row address latch circuit for latching the row address signal in response to a row address latch signal;
    a column address latch circuit for latching the column address signal in response to a column address latch signal; and
    timing control means responsive to a clock signal for controlling timings of internal operations of the semiconductor memory device, the timing control means generating: the row address latch signal by using, as a trigger, a first edge of the clock signal; generating a sense amplifier enable signal for activating the sense amplifiers, in response to the first edge, after a lapse of a given delay time; generating the column address latch signal by using, as a trigger, a second edge of the clock signal occurring after the first edge; and generating a bit line precharge signal for precharging the bits lines, in response to the second edge, after a lapse of a given delay time.

2. The semiconductor memory device of claim 1, wherein:
    the first and second edges of the clock signal correspond to a falling edge and a rising edge, respectively, or to a rising edge and a falling edge, respectively.

3. The semiconductor memory device of claim 1, the timing control means including:
    page-mode control means for judging whether a page-mode control signal for determining whether a page mode should be set or not is in one state or in the other state by using, as a trigger, the first or second edge of the clock signal wherein:

the page-mode control means enables the precharging of the bit lines by using the second edge as a trigger, while enabling the operation of latching another row address signal by using a third edge occurring after the second edge as a trigger if the result of judgement indicates one state, and wherein the page-mode control means disables the precharging of the bit lines by using the second edge as a trigger, while disabling the operation of latching another row address signal by using the third edge as a trigger if the result of judgment indicates the other state.

4. The semiconductor memory device of claim 3, wherein the first, second, and third edges of the clock signal correspond to a falling edge in a first clock cycle, a rising edge in the first clock cycle, and a falling edge in a second clock cycle subsequent to the first clock cycle in this order or correspond to the rising edge in the first clock cycle, the falling edge in the first clock cycle, and the rising edge in the second clock cycle subsequent to the first clock cycle in this order.

5. The semiconductor memory device of claim 1, further comprising write control means for latching a write control signal in response to a write signal latch signal to generate an internal write control signal for controlling a data input circuit, wherein the timing control means further generates the write signal latch signal by using the second edge of the clock signal as a trigger.

6. The semiconductor memory device of claim 1, further comprising:

a data output circuit for outputting data amplified by the sense amplifiers; and a data output disabling means coupled to the data output circuit, for receiving an output enable signal to generate an output control enable signal and resetting the output control enable signal in response to an output enable reset signal, wherein the timing control means further generates the output enable reset signal, in response to the first edge of the clock signal, after a lapse of a given time.

* * * * *